(12) United States Patent
Beintner et al.

(10) Patent No.: US 6,967,384 B2
(45) Date of Patent: Nov. 22, 2005

(54) STRUCTURE AND METHOD FOR ULTRA-SMALL GRAIN SIZE POLYSILICON

(75) Inventors: Jochen Beintner, Wappingers Falls, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 10/733,381

(22) Filed: Dec. 12, 2003

(65) Prior Publication Data
US 2005/0130364 A1 Jun. 16, 2005

(51) Int. Cl.[7] ................... H01L 29/772; H01L 21/8232
(52) U.S. Cl. ..................... 257/412; 438/198; 438/585
(58) Field of Search ................ 438/585, 592–594, 438/198; 257/412

(56) References Cited

U.S. PATENT DOCUMENTS

| | | | | |
|---|---|---|---|---|
| 4,931,897 A | * | 6/1990 | Tsukamoto et al. | 361/313 |
| 5,429,972 A | * | 7/1995 | Anjum et al. | 438/398 |
| 5,953,254 A | * | 9/1999 | Pourkeramati | 365/185.26 |
| 6,228,740 B1 | * | 5/2001 | Niroomand et al. | 438/398 |
| 6,294,442 B1 | | 9/2001 | Kamal | |

* cited by examiner

Primary Examiner—Evan Pert
(74) Attorney, Agent, or Firm—Wan Yee Cheung, Esq.; McGinn IP Law Group, PLLC

(57) ABSTRACT

A method of forming a semiconductor structure (and the resulting structure), includes providing a nitride layer between a silicon-containing layer and a polysilicon layer.

37 Claims, 5 Drawing Sheets

500

STRUCTURE AND METHOD FOR ULTRA-SMALL GRAIN SIZE POLYSILICON

BACKGROUND OF THE INVENTION

1. Field of the Invention

The present invention generally relates to a semiconductor device and method therefor, and more particularly to a structure and method of ultra-small (e.g., within a range of about 10 nm to about 20 nm) grain size polysilicon.

2. Description of the Related Art

State-of-the-art complementary metal oxide semiconductor (CMOS) gates are beginning to target 30 nm lengths. Typical polysilicon grain sizes are in the 50 nm range (e.g., see S. Wolf, Silicon Processing for the VLSI Era, Vol. 2, Lattice Press, 1990; U.S. Pat. No. 6,294,442).

However, this 50 nm grain size creates many problems including that the polysilicon is more bamboo-like along the gate lines, and conductivity/resistivity becomes more sensitive to grain size at this nano-scale level (e.g., conductivity/resistivity tracks with grain size).

More specifically, assume that one has a 30 nm grain size and a 30 nm gate polysilicon is etched so that across the width there is one grain (e.g., there is a single crystal along the width). The length of the gate may be microns long. Hence, there is a single crystal all along the gate in a cross-section. Thus, a ladder structure (e.g., a "bamboo-like" structure) is formed in which the width is very small, but the length may be very long. This is problematic because the resistance would be very large otherwise.

Another problem is that the diffusion of dopants in these "large-grain" polysilicon gates will probably be mostly through lattice diffusion (similar to that of crystalline silicon) which is relatively slow (e.g., typically about a factor of 10 slower than diffusion for polysilicon) and sufficient dopant may not reach the polysilicon/oxide interface, where dopant is also needed to prevent polysilicon depletion effects.

Further, one may have to increase thermal budgets enormously (e.g., to 1050° C. for about 5 seconds or the like, depending upon the dopants used, etc.) to cause dopants to reach the polysilicon/oxide interface and recoup this depletion loss, which then impacts channel doping adversely.

Therefore, for small gate lengths, it is very useful to have polysilicon with a much smaller average grain size of 10–20 nm. However, prior to the present invention, such has not been achieved.

That is, it is well known that polycrystalline grain size may somewhat correlate with film thickness, and given that the typical gate stack thicknesses are in the 100 nm range, it is difficult to limit the grain size to the 10–20 nm range.

Indeed, all previous methods at controlling the average grain size through various deposition conditions have consistently yielded best defect-free material only in the ~50 nm average grain size range.

Thus, prior to the present invention, there has been no method for making small nano-scale grained polysilicon with a concomitant structure that goes along with it.

SUMMARY OF THE INVENTION

In view of the foregoing and other exemplary problems, drawbacks, and disadvantages of the conventional methods and structures, an exemplary feature of the present invention is to provide a method for making small nano-scale grained polysilicon with a concomitant structure that results therefrom.

In a first exemplary aspect of the present invention, a method of forming a semiconductor structure (and the resulting structure), includes providing a nitride layer between a silicon-containing layer and a polysilicon layer.

In a second exemplary aspect of the present invention, a method of making a semiconductor structure (and the resulting structure), includes forming a gate stack including a silicon-containing layer and a polysilicon layer with a nitride layer formed therebetween. The silicon-containing layer sets the polysilicon grain size.

In a third exemplary aspect of the present invention, a semiconductor structure, includes a first polysilicon layer, a second polysilicon layer formed over the polysilicon layer, and a nitride layer formed between the first and second polysilicon layers. A grain size of the first polysilicon layer is smaller than that of the second polysilicon layer.

With the unique and unobvious aspects of the present invention, ultra-small polysilicon grains at nano-scale size (e.g., within a range of about 10 nm to about 20 nm) can be created, and their size can be retained through heat cycles.

Preferably, the invention deposits thin (e.g., 10–20 nm) amorphous Si, or thin polysilicon or SiGe, with amorphous silicon being most preferable since it is harder to obtain precise polysilicon thickness control in the 10–20 nm range, but very easy to obtain thin a-Si thickness control in this thickness range.

The invention also preferably deposits an ultra-thin (e.g., within a range of about 5–15 Å) nitride barrier, which is known to be electrically conductive, is not a dopant diffusion barrier, and prevents polysilicon grain growth templating from single crystal silicon in straps in DRAMs.

Thereafter, preferably the invention grows the remaining polysilicon on the nitride barrier to set the correct gate stack thickness.

The present inventors have recognized that breaking the polysilicon film into two parts (e.g., first and second layers) where the first polysilicon layer sets the polysilicon grain size, is very advantageous in achieving such ultra small polysilicon grain size.

There are many advantages of the present invention including that it is very simple and inexpensive to integrate the present invention into the process. Additionally, the invention is applicable to any substrate, bulk or silicon-on-insulator (SOI), SiGe, etc.

Additionally, the inventive approach is readily detectable (and has been validated by the present inventors) because SIMS will show a nitrogen peak within the polysilicon and TEMs/SEMs will reveal small grains and an ultra-thin layer within the polysilicon.

Further, the small grain size facilitates dopant diffusion and reduces polysilicon depletion.

BRIEF DESCRIPTION OF THE DRAWINGS

The foregoing and other exemplary purposes, aspects and advantages will be better understood from the following detailed description of exemplary embodiments of the invention with reference to the drawings, in which:

FIG. 1 illustrates forming a gate dielectric and depositing a thin amorphous Si (~10–20 nm);

FIG. 2 illustrates depositing an ultra-thin (e.g., 5–15 Å) nitride barrier at 550–750° C.; and FIG. 3 illustrates depositing remaining needed polysilicon;

DETAILED DESCRIPTION OF EXEMPLARY EMBODIMENTS OF THE INVENTION

Figure 1:
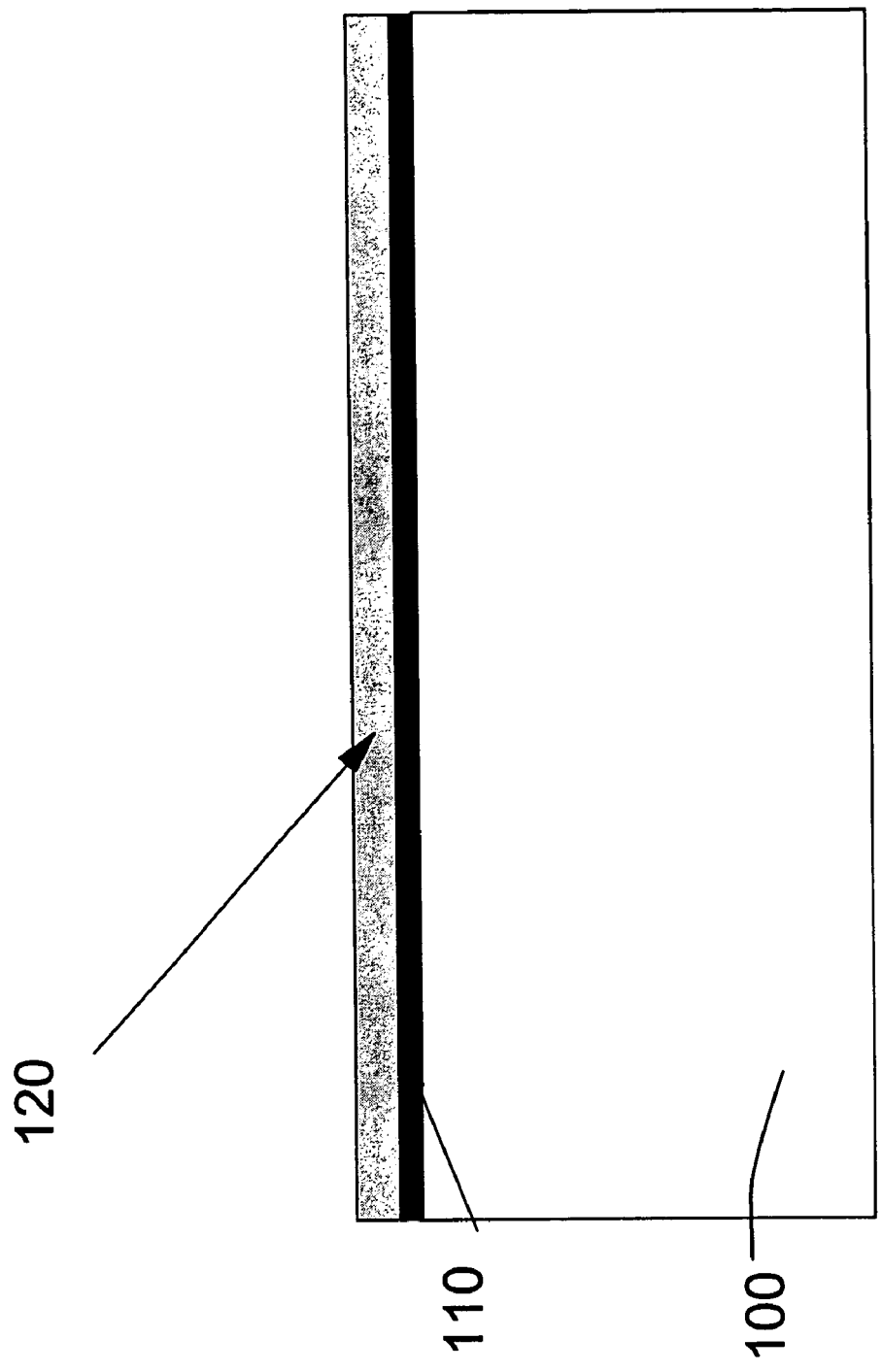
FIGS. 1–3 illustrate processing steps of a first exemplary embodiment of the inventive method and specifically.

Referring now to the drawings, and more particularly to FIGS. 1–5, there are shown exemplary embodiments of the method and structures according to the present invention.

Exemplary Embodiment

Again, as mentioned above, there are no known solutions to creating ultra-small polysilicon grains at nano-scale size (e.g., within a range of about 10 nm to about 20 nm), let alone retaining their size through heat cycles.

The present solution incorporates the idea of breaking the polysilicon film into two parts where the first layer sets the polysilicon grain size.

First, either thin (10–20 nm) amorphous Si or thin polysilicon is deposited on a gate dielectric, which is typically formed on a substrate. Then, an ultra-thin (e.g., 5–15 Å) nitride barrier is deposited on the a-Si or thin polysilicon. Such a nitride barrier is known to be electrically conductive, is not a dopant diffusion barrier, and has been known to prevent polysilicon grain growth templating from single crystal silicon in straps in dynamic random access memories (DRAMs) or the like.

Then, the remaining polysilicon is grown (deposited) on the nitride barrier to set the correct gate stack thickness.

With the above in mind and turning now to the processing steps in greater detail, in a first embodiment, FIG. 1 illustrates forming a gate dielectric 110 on a substrate 100. Preferably, the gate dielectric 110 has a thickness in a range within about 9 Å to about 50 Å. Preferably, the gate dielectric may be formed by any suitable dielectric such as an oxide, an oxynitride, an oxide-nitride stack combination, etc., and the like.

Thereafter, a thin silicon layer 120 (e.g., either a polysilicon or an amorphous Si, having a thickness on the order of about ~10–20 nm) is deposited on the gate dielectric at a temperature typically below 550° C.

Amorphous silicon is preferable since it is more difficult to get precise polysilicon thickness control in the approximate 10–20 nm range, but very easy to get thin a-Si thickness control in the approximate 10–20 nm thickness range.

Figure 2:
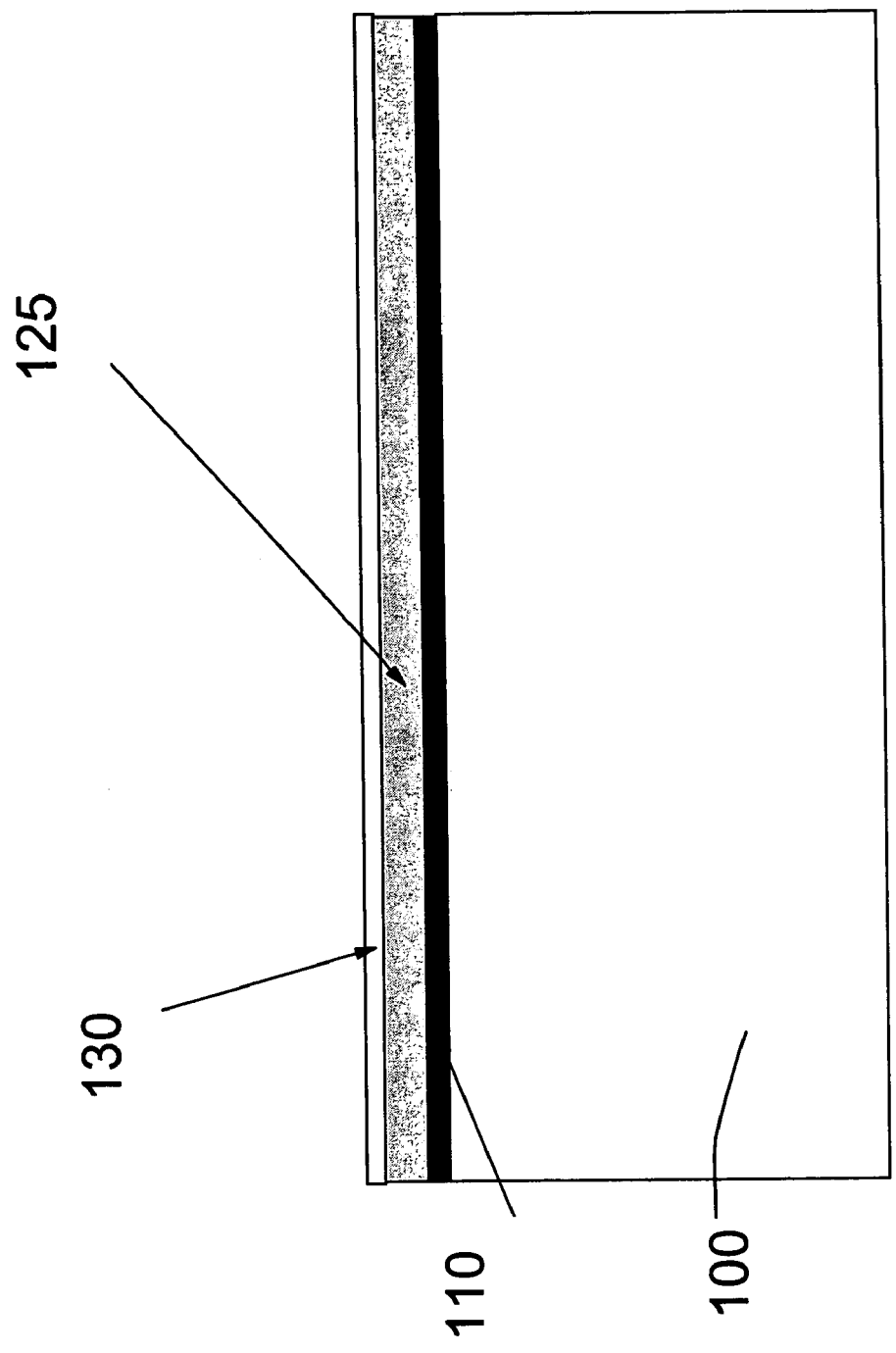

Then, as shown in FIG. 2, an ultra-thin (e.g., on the order of about 5 Å to about 15 Å) nitride barrier 130 is formed (e.g., via, for example, a furnace anneal, in for example, an ammonia ambient (or typically referred to as an "NH$_3$ bake")) on the silicon layer 120 at a temperature within a range of about 550° C. to about 750° C. for about 5 minutes to about 20 minutes, and more preferably for about 15 minutes.

It is noted that methods other than the furnace anneal could be employed as would be known by one of ordinary skill in the art taking the present application as a whole. The nitride barrier 130 is preferably silicon nitride.

It is noted that the 550–750° C. temperature range is preferably used since the nitride layer is very thin, and a higher temperature (e.g., above 750° C.) would result in a thicker nitride. Thus, the above temperature range is believed to be the best. Additionally, a higher temperature would result in the amorphous silicon below (which begins to convert to polysilicon at about 550° C.) to convert to polysilicon and would begin growing thicker and thicker. Hence, this approximate 550–750° C. temperature range is used for obtaining the approximate 5–15 Å layer.

Thus, it is noted that a-Si will convert to polysilicon with about 10–20 nm grain size. Reference numeral 125 illustrates the small grain (about 10–20 nm grain size) polysilicon layer in FIG. 2.

Figure 3:
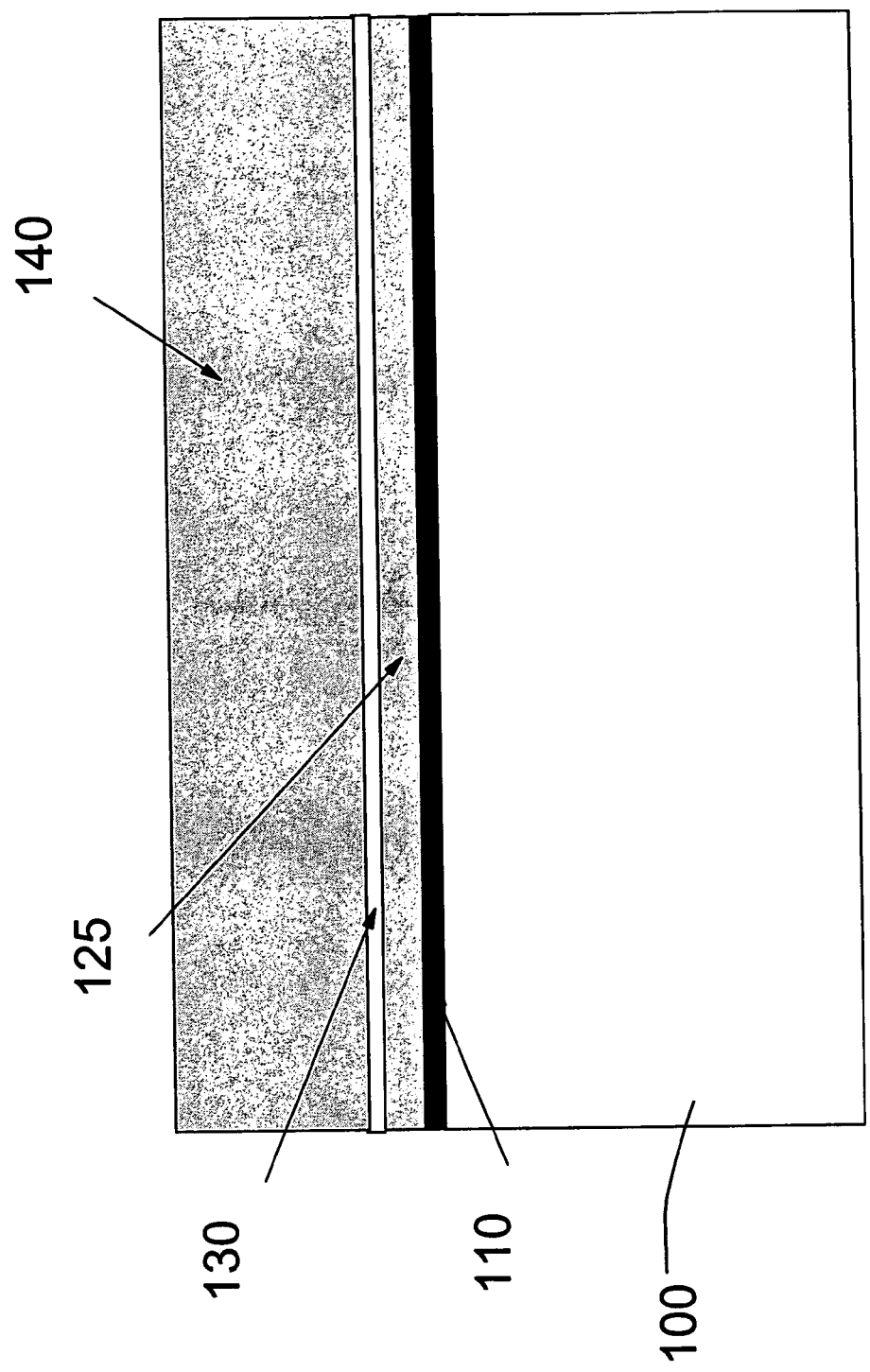

Then, in FIG. 3, remaining needed polysilicon 140 is deposited. The grain size here (e.g., of polysilicon 140) can be different (e.g., typically within a range of about 30 nm to about 80 nm), but the polysilicon layer 125 retains its grain size because of the ultra-thin nitride barrier.

It is noted that there is no limit to the thickness of the polysilicon 140 which is deposited, but typically it is within a range of about 80 nm to about 130 nm. It is noted that the typical gate stack has a height (thickness) of about 100–150 nm. Additionally, while the choice of nitride as an insulator may appear unusual in certain contexts, it is noted that the nitride barrier layer does not pose an electrical or diffusion barrier in different applications (e.g., DRAM, etc.).

Thereafter, subsequent processes for gate and device building are performed, to complete the gate stack and device. That is, the polysilicon etch is performed including full gate stack etch, form extensions, form sidewall spacers, form source and drain, etc. Such processes are standard and conventional, and, for brevity, will not be further described herein.

Thus, this embodiment provides much smaller grain size which provides the higher activation. Additionally, the inventive process does not result in any substantial increase in thermal budget from process of building the conventional structures. There may be a slight increase in thermal budget due to the splitting of the gate into two parts (e.g., any additional thermal budget is due to the nitride layer), but this is unnoticeable since it is performed early in the gate building process (early in the gate stack).

Second Embodiment

Figure 4:
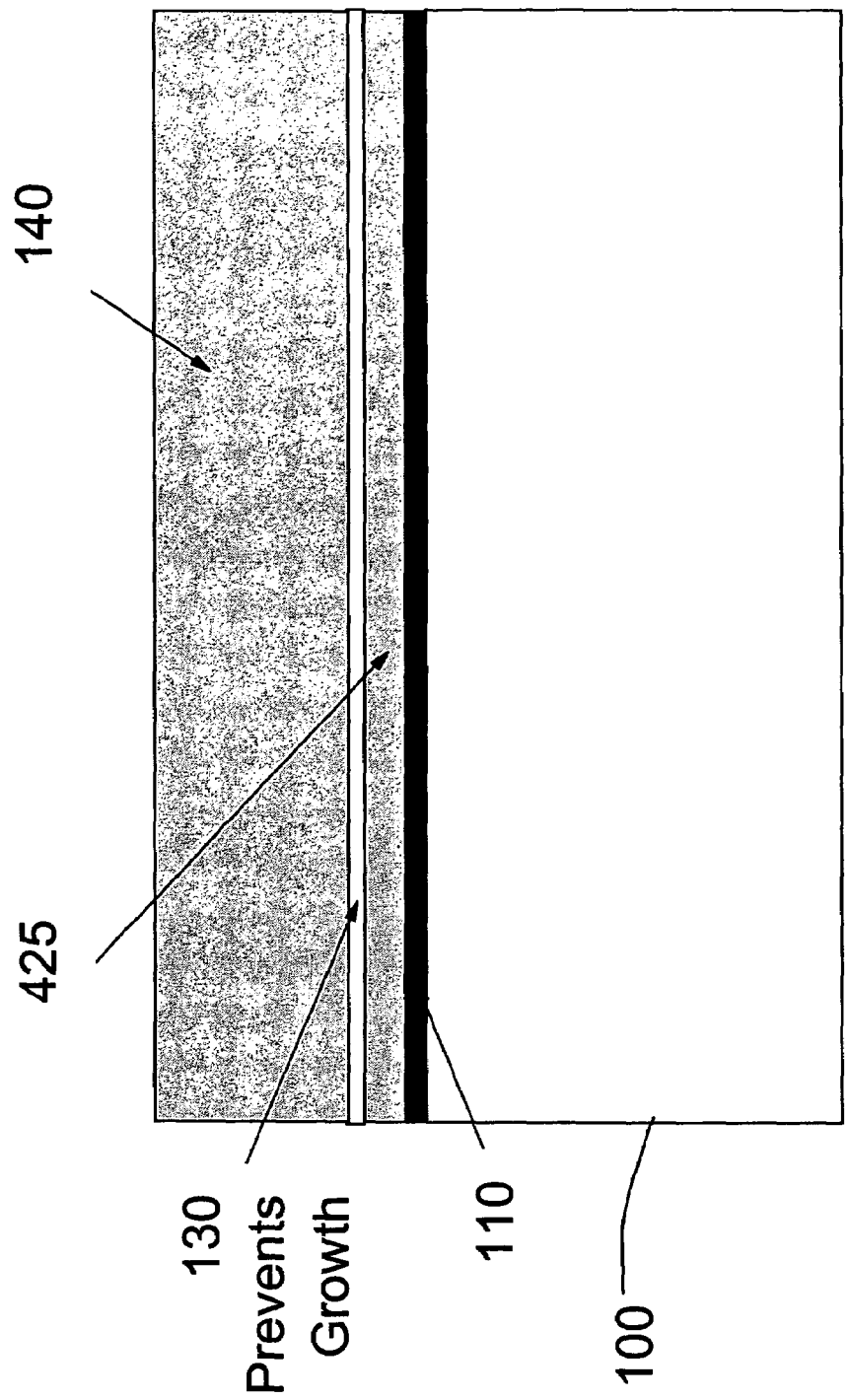
FIG. 4 illustrates a second embodiment of the inventive method according to the present invention.

Turning to FIG. 4, a second embodiment of the inventive method is shown.

Specifically, FIG. 4 illustrates a gate stack formed by the second embodiment in which the small grained polysilicon 125 of the first embodiment is replaced by a small-grained SiGe layer 425. In addition to the advantages of the first embodiment, this SiGe layer provides the additional advantage of better activation of the dopants (e.g., see Ozturk et al., International Workshop on Junction Technology, 2001, page 77).

More specifically, alternatively to the amorphous Si or the polysilicon for the first layer 125 in the first embodiment, the second embodiment of the present invention recognizes that it is also advantageous if SiGe is used for the thin layer 125. That is, SiGe is known to have better dopant activation than the small grained polysilicon, and the activation could be even higher for ultra-small (e.g., approximately 10–20 nm) grain poly-SiGe.

Hence, as shown in FIG. 4, the process flow is the same as described above for the first embodiment, except that a poly-SiGe 425 is deposited on the gate dielectric first followed by the ultra-thin nitride barrier and the remaining needed polysilicon.

The General Method of the Invention

Figure 5:
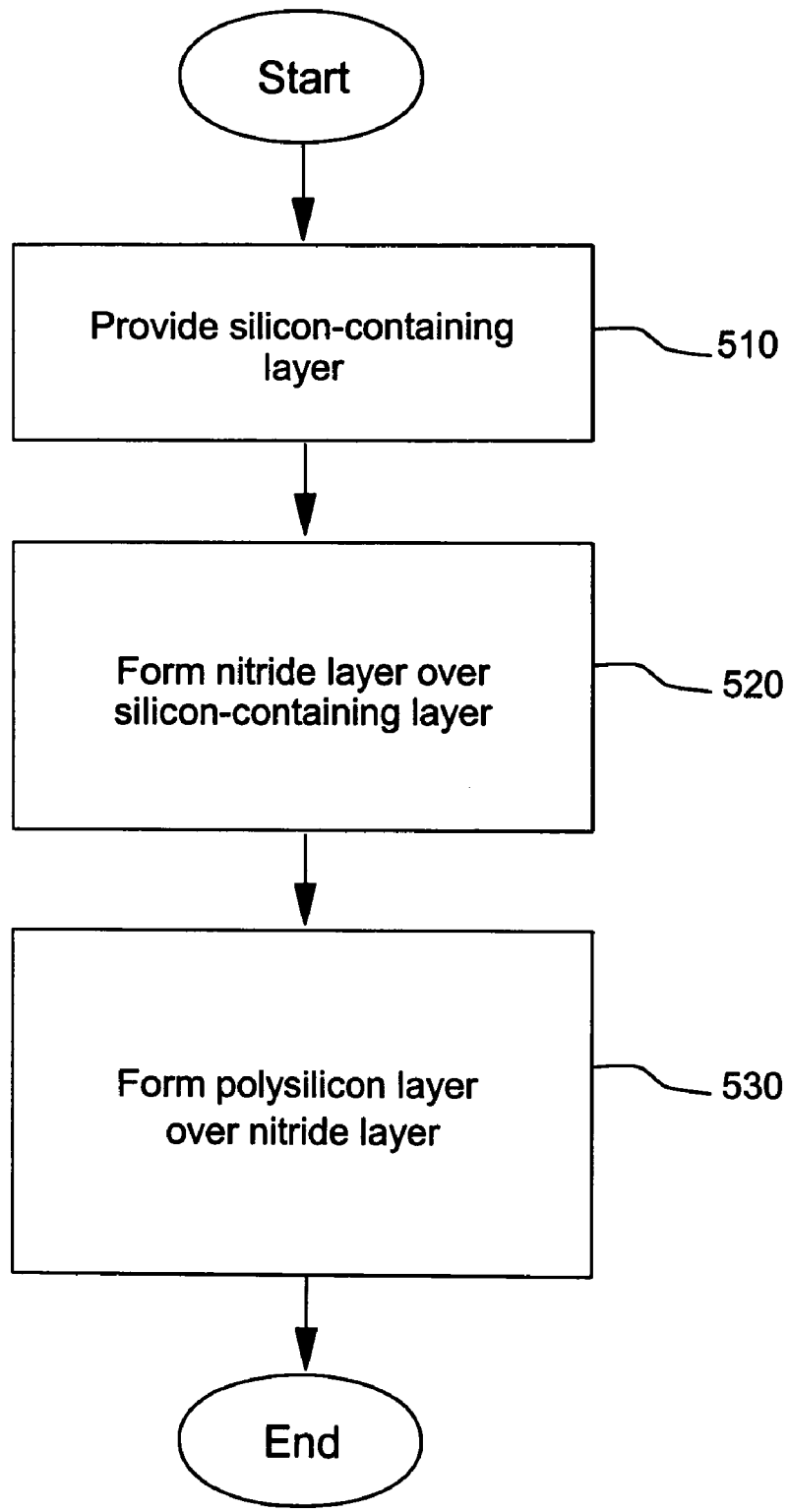
FIG. 5 illustrates a flowchart of the method 500 according to the present invention.

FIG. 5 shows a method 500 according to the present invention for practicing the first and second embodiments.

Specifically, a method 500 of forming a semiconductor structure, includes a step 510 of providing a silicon-containing layer (e.g., a layer containing any of an amorphous silicon, a polysilicon, and a SiGe layer, preferably having a small grain size) preferably on a gate dielectric. Thus, for purposes of the present application, "silicon-containing" includes any of an amorphous silicon, a polysilicon, and a SiGe layer.

If amorphous silicon or polysilicon is used as the silicon-containing layer (e.g., as in the first embodiment), then such amorphous silicon or polysilicon layer is preferably deposited at a temperature typically below 550° C. If the SiGe is deposited as the silicon-containing layer (e.g., the SiGe layer of the second embodiment), there is no such temperature constraint as in the first embodiment.

In step 520, a nitride layer is formed over the silicon-containing layer, preferably at a temperature between about 550° C. and 750° C.

In step 530, a polysilicon layer (having any grain size desired) is formed over the nitride layer. Thus, the gate stack is formed. As mentioned above, to complete the device, the conventional device forming processes can be performed thereafter.

There are many advantages of the present invention including that it is very simple and cheap to integrate this into the process. Additionally, the invention is applicable to any substrate, bulk or SOI, or SiGe, strained silicon, etc.

Additionally, the inventive approach is readily detectable (and thus validated) because scanning ion mass spectroscopy (SIMS) will show a nitrogen peak within the polysilicon and TEMs/SEMs will reveal small grains and an ultra-thin layer within the polysilicon.

While the invention has been described in terms of several exemplary embodiments, those skilled in the art will recognize that the invention can be practiced with modification within the spirit and scope of the appended claims.

For example, in addition to the conductive materials described above, other conductive materials (e.g., such as possibly some refractory nitrides) could be substituted and the invention would still be highly advantageous.

Further, it is noted that, Applicant's intent is to encompass equivalents of all claim elements, even if amended later during prosecution.

What is claimed is:

1. A method of forming a semiconductor structure, comprising:
   providing a nitride layer between a silicon-containing layer and a polysilicon layer,
   wherein said silicon-containing layer comprises a grain size substantially within a nano-scale size.

2. The method of claim 1, further comprising:
   forming an amorphous silicon layer, to provide said silicon-containing layer.

3. The method of claim 1, further comprising:
   forming a polysilicon layer, to provide said silicon-containing layer.

4. The method of claim 1, further comprising:
   forming a SiGe layer, to provide said silicon-containing layer.

5. The method of claim 1, wherein a grain size of said silicon-containing layer is smaller than that of said polysilicon layer.

6. The method of claim 1, wherein said silicon-containing layer is formed below said polysilicon layer.

7. The method of claim 1, wherein said nitride layer comprises a silicon nitride layer.

8. The method of claim 1, wherein said semiconductor structure comprises a gate stack, and
   wherein a grain size of said silicon-containing layer is smaller than that of said polysilicon layer.

9. The method of claim 1, wherein said nitride layer is formed on a surface of said silicon-containing layer and said polysilicon layer is formed on a surface of said nitride layer.

10. The method of claim 1, wherein said silicon-containing layer has a grain size substantially within a range of about 10 nm to about 20 nm.

11. The method of claim 5, wherein said grain size of said silicon-containing layer is substantially within a range of about 10 nm to about 20 nm.

12. The method of claim 1, further comprising:
    depositing one of an amorphous Si, a polysilicon, and poly-SiGe as said silicon-containing layer.

13. The method of claim 12, wherein said one of the amorphous silicon, the polysilicon, and the poly-SiGe has a thickness of about 10 nm to about 20 nm.

14. The method of claim 1, wherein said nitride layer has a thickness within a range of about 5 Å to about 15 Å.

15. The method of claim 1, further comprising:
    forming said silicon-containing layer on a gate dielectric, said gate dielectric being formed on a substrate,
    wherein a grain size of said silicon-containing layer is smaller than that of said polysilicon layer.

16. The method of claim 15, wherein said substrate comprises any of a bulk silicon substrate, a silicon-on-insulator, and a SiGe substrate.

17. The method of claim 15, wherein said gate dielectric has a thickness within a range of about 9 Å to about 50 Å.

18. The method of claim 15, wherein said gate dielectric comprises any of an oxide, an oxynitride, and an oxide-nitride stack combination.

19. The method of claim 2, wherein said amorphous Si is deposited at a temperature below 550° C.

20. The method of claim 3, wherein said polysilicon is deposited at a temperature below 550° C.

21. The method of claim 12, wherein said nitride layer is formed by a furnace anneal on said one of the amorphous silicon, the polysilicon, and the poly-SiGe.

22. The method of claim 21, wherein said nitride layer is formed by said furnace anneal at a temperature within a range of about 550° C. to about 750° C.

23. The method of claim 21, wherein said nitride layer is formed by said furnace anneal in an ammonia ambient.

24. The method of claim 22, wherein said nitride layer is formed by said furnace anneal for about 5 minutes to about 20 minutes.

25. The method of claim 24, wherein said nitride layer is formed by said furnace anneal for about 15 minutes.

26. The method of claim 1, wherein said polysilicon layer has a thickness within a range of about 80 nm to about 130 nm.

27. A method of making a semiconductor structure, comprising:
    forming a gate stack including a silicon-containing layer and a polysilcon layer with a nitride layer therebetween,
    wherein a grain size of the silicon-containing layer is set without affecting a polysilicon grain size of the polysilicon layer.

28. A method of forming a gate stack, comprising:
    providing a nitride layer between a silicon-containing layer and a polysilicon layer, wherein said silicon-containing layer has a grain size substantially within a range of about 10 nm to about 20 nm.

29. A semiconductor structure, comprising:
    a first polysilicon layer; a second polysilicon layer formed over said polysilicon layer; and a nitride layer formed between said first and second polysilicon layers, wherein a grain size of said first polysilicon layer is smaller than that of said second polysilicon layer, and wherein said grain size of said first polysilicon layer comprises a grain size substantially within a nano-scale size.

30. The structure of claim 29, wherein said first polysilicon layer has a grain size substantially within a range of about 10 nm to about 20 nm.

31. The structure of claim 29, wherein said nitride layer has a thickness within a range of about 5 Å to about 15 Å.

32. The structure of claim 29, further comprising:
a gate dielectric on which said first polysilicon layer is formed; and a substrate on which said gate dielectric is formed.

33. The structure of claim 32, wherein said substrate comprises any of a bulk silicon substrate, a silicon-on-insulator, and a SiGe substrate.

34. The structure of claim 32, wherein said gate dielectric has a thickness within a range of about 9 Å to about 50 Å.

35. The structure of claim 32, wherein said gate dielectric comprises any of an oxide, an oxynitride, and an oxide-nitride stack combination.

36. The apparatus of claim 29, wherein said second polysilicon layer has a thickness within a range of about 80 nm to about 130 nm.

37. A gate stack, comprising:
a first polysilicon layer; a second polysilicon layer; and a nitride layer formed between said first and second polysilicon layers, wherein said first polysilicon layer has a grain size substantially within a range of about 10 nm to about 20 nm.

* * * * *